INVERTED SOLID STATE DIODE

Filed Aug. 15, 1968

John A. Scott-Monck
Arthur J. Learn,
*INVENTORS*

BY [signature]

AGENT

United States Patent Office 3,597,270
Patented Aug. 3, 1971

3,597,270
INVERTED SOLID STATE DIODE

John A. Scott-Monck, Redondo Beach, and Arthur J. Learn, West Concord, Calif., assignors to TRW Inc., Redondo Beach, Calif.

Filed Aug. 15, 1968, Ser. No. 752,939
Int. Cl. B44d *1/18*; C23c *13/04*
U.S. Cl. 117—217 8 Claims

ABSTRACT OF THE DISCLOSURE

This invention relates to a method of producing an inverted thin film solid state device, i.e., a solid state device in which a semiconductive film is deposited on a high work functional metal. The inverted solid state device is produced by applying a film of high work function metal to a surface and then cooling the metal below room temperature while a thin film of sulfur is deposited on the surface of the metal. A thin layer of cadmium sulfide is deposited on the sulfur to prevent evaporation, the temperature is raised, and the deposition of the cadmium sulfide is completed. Deposition of a thin film of low work function metal on the cadmium sulfide completes the inverted solid state device.

In the art of producing solid state devices, serious problems result in attempts to deposit semiconductive compounds onto high work function metals. If a high work function metal such as gold is deposited first, it invariably forms an ohmic contact with a subsequently deposited semiconductive compound such as cadmium sulfide.

It is postulated that the disassociation of the cadmium sulfide during deposition onto the surface of the metal is the cause of the poor barrier between the metal and the cadmium sulfide. As the cadmium and sulfur arrive at the substrate, they would ordinarily recombine into cadmium sulfide. The intermetallic compound formed upon dissociation of cadmium sulfide prevents a maximizing of the normal metal to semiconductor contact, and the barrier height is reduced accordingly.

Since the formation of either a thin film, metal-base transistor, or triode device necessitates that the metal rectify both in the inverted as well as the normal position, the solution of this problem opens the way to fabrication of active thin film devices.

In general, this invention provides for the deposition of an anionic component of a semiconductive material onto the surface of a high work function metal cooled below room temperature. A thin layer of the semiconductive material is deposited on the anionic component and the temperature is raised for completion of the semiconductor deposition. The inverted solid state device is completed with the evaporation of a thin film of low work function metal onto the surface of the semiconductor.

Other objects and features of this invention and a better understanding thereof may be had by referring to the following description and claims, taken in conjunction with the accompanying drawing in which:

Figure 1:
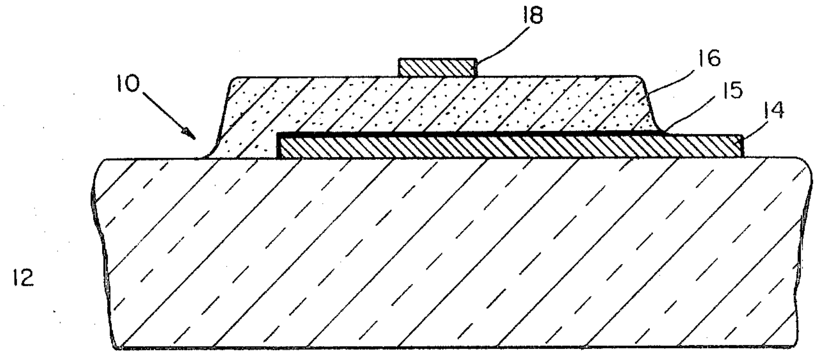
FIG. 1 is an enlarged cross-sectional view of a thin film semiconductive diode made according to the method.

Referring to FIG. 1, a thin film semiconductive diode 10 includes a substrate 12 of smooth, inert, nonconductive material, such as plastics, ceramics, or dielectrics, a first thin film metal layer 14, a thin layer of the anionic component of the semiconductive compound 15, a thin film semiconductive layer 16, and a second metal thin film layer 18, arranged in that order. The first metal layer 14 forms a blocking contact with the semiconductive layer 16 and the second metal layer 18 forms an ohmic contact with the semiconductive layer 16. The metal layers 14 and 18 are preferably applied as strips crossing normal to each other.

When the semiconductive layer 16 is made of n-type semiconductive material, such as cadmium sulfide, zinc sulfide, or cadmium telluride, the blocking contact layer 14 is made of high work function metal and the ohmic contact layer 18 is made of low work functional metal. Examples of metals with low work function suitable for the ohmic contact layer 18 are aluminum, indium, and chromium. Examples of metals with high work function suitable for the blocking contact layer 14 are gold, platinum, palladium, and nickel.

In accordance with a preferred embodiment of the process of the invention, the blocking contact layer 14 is first vacuum deposited on a cleaned and polished substrate 12. A vacuum pressure of the order of $10^{-7}$ torr is preferred. The blocking contact layer 14 is deposited to a thickness of 100 angstroms or greater depending on the metal's nucleating properties, with the substrate 12 at some suitable temperature.

In the next step, substrate 12 is cooled below room temperature and a thin film of sulfur 15 amounting to less than one hundred angstroms is deposited on metal contact 14. After the sulfur evaporation, a small amount of cadmium sulfide is deposited to prevent re-evaporation of the sulfur during subsequent heating. The temperature of substrate 12 is slowly raised at a rate of no greater than 5° C. per minute to avoid cracking the previously deposited cadmium sulfide. Upon reaching a substrate temperature of between 100° C. and 175° C., cadmium sulfide is deposited to a thickness of 2 to 3 microns.

During heating, the deposited layers presumably interact to some extent. Since there is excess sulfur at the metal surface, the probability of elemental cadmium combining with the metal is decreased and a better defined barrier results because of the reaction between the sulfur and elemental cadmium to form stoichiometric cadmium sulfide. Interaction of sulfur with the metal can be reduced by choosing the more electronegative metals. This follows because the heats of formation for metal sulfides decrease with increased electronegativity of the metal and the heat of formation can be used as a measure of probability of interaction of the constituents.

It is desirabe to heat the substrate 12 while depositing the semiconductive layer 16 in order to achieve high resistivity in the latter thus obtaining a depletion region of substantial width. A deposition rate of about 10 angstroms per second has been used successfully with a substrate temperature of 175° C. These conditions of deposition have resulted in the production of n-type semiconductive films which exhibit preferred orientation, with the *c*-axis nearly normal to the substrate surface and with film resistivity of the order of $10^4$ ohm-centimeters. Preferred *c*-axis orientation and resistivity both decrease with decreased substrate temperature and/or increased deposition rate.

A preferred vapor deposition source for evaporating cadmium sulfide and other crystalline powders is disclosed in copending application of Rueben S. Spriggs et al., Ser. No. 553,981, filed May 31, 1966, and entitled "Vacuum Evaporation Source," now U.S. Pat. 3,405,251. The thin film semiconductive layer 16 formed by vacuum deposition is poycrystalline in structure as contrasted with single crystal semiconductors.

Finally, ohmic contact layer 18 is vacuum deposited onto semiconductive layer 16, to complete the inverted diode structure. Ohmic contact layer 18 is deposited to a thickness of 100–3000 angstroms while the temperature of substrate 12 is maintained at room temperature.

Diode structures have been made according to the invention in which the crossing strips making up the two metal layers 14 and 18 form cross-over areas of either 0.1 $cm.^2$ or 0.01 $cm.^2$.

Thin film diodes made according to the above-described method exhibit rectification ratios averaging $10^5$:1 at one volt and in some cases as high as $10^6$:1 at between 3 and 5 volts. Photoemission measurements yield barrier heights at the gold-CdS interface in the range of 0.8 to 1.0 volt. The barrier height is essentially the same for all blocking contact layers made of high work function metal such as gold, platinum, palladium, and nickel.

Figure 2:
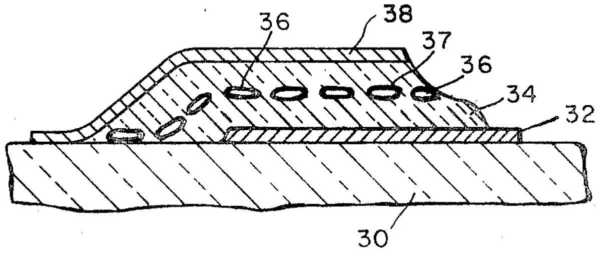
FIG. 2 is a similar view of a gridded triode according to the method.

The inventive process described above in connection with inverted diodes is a great improvement wherever high work function metals are to be applied in any manner to a semiconductive material. For example, in FIG. 2 there is shown a gridded triode of the sort described and claimed in U.S. patent application Ser. No. 368,811, entitled "Method of Forming Mesh-Like Structure and Article Produced Thereby," filed May 20, 1964, in the name of Reuben S. Spriggs and Arthur J. Learn, now U.S. Pat. 3,355,320. The triode of FIG. 2 is fabricated by thin-film techniques on an insulating substrate 30, beginning with a low work function metallic contact 32, followed by a first layer of semiconductor 34 (preferably CdS). The semiconductor layer 34 is deposited in ohmic contact with the first contact, so that it acts as the cathode film of the device.

Next the substrate is removed from the system and heated in a bath of sulfur saturated Dow Corning DC 704 silicone oil to activate the semiconductor surface. Temperatures of between 250° C. and 300° C. for periods of time of approximately five minutes are sufficient for this purpose. The substrate is then removed from the bath an the excess oil removed with organic solvent. Then it is remounted in the vacuum system and pumped down to about $1\times10^{-6}$ mm. A high work function metal control grid 36 is laid on top of the activated semiconductor and upon cooling, a layer of sulfur 37 is deposited on top of the control grid 36 so that the metal control grid will be completely surrounded by stoichiometric cadmium sulfide. This is done with the substrate cooled to below room temperature to assure sticking of the sulfur. While still cool, a small amount of semiconductor is deposited on the surface of the sulfur 37, the temperature of the substrate is then raised and the remaining semiconductor is deposited as previously described. After the deposition of all of the semiconductor the device is completed by deposition of a second layer of low work function metal 38 as an ohmic contact.

Figure 3:
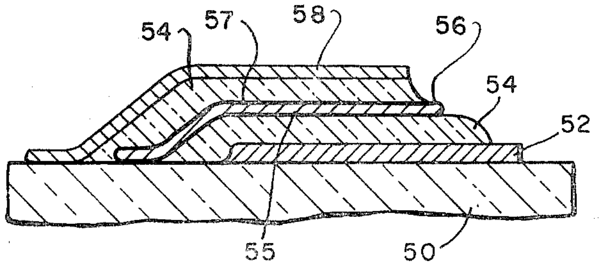
FIG. 3 is a similar view of a metal base transistor according to the invention.

Referring to FIG. 3, a metal base transistor or any other thin-film active element according to this invention is made by a process which includes preparing a substrate 50 of plastic, ceramic, dielectric or the like, then depositing a first low work function metal film 52 thereon. The metal film 52 is the input electrode of the metal base transistor of FIG. 3. A first layer of semiconductive material such as, cadmium sulfide 54 is then deposited upon metal film 52 in ohmic contact, as with the triode of FIG. 2. The substrate is heat treated then in a sulfur saturated silicone oil bath which assures a thin layer of stoichiometric semiconductor 55 upon semiconductor 54. Rather than laying a grid 36 upon the sulfur as was done in FIG. 2, a thin film of high work function metal 56 is deposited. A layer of sulfur is deposited at low temperature to assure adherence to the metal 56. While still cool, a small amount of the second layer of semiconductor 54 is deposited on the surface of the sulfur, and the temperature of the substrate is raised before depositing the remaining semiconductor material. This causes the sulfur to combine with the excess Cd present in the cadmium sulfide to form a stoichiometric layer of cadmium sulfide 57 thus assuring a "clean" surface for the rectifying contact. After completion of deposition of all the semiconductor material, a second layer of low work function metal 58 is applied to complete the metal base transistor. FIG. 3 component is distinguished in that it has the low impedance characteristic of transistors, rather than the high input impedance exhibited by FIG. 2 triode.

A number of alternative arrangements will readily suggest themselves to those skilled in the art. However, although the invention has been described with a certain degree of particularity, it is to be understood that the present disclosure has been made only by way of example and that numerous changes in the details of construction and the combination and arrangements of parts may be resorted to without departing from the spirit and the scope of the invention as hereinafter claimed.

We claim:

1. A method for producing inverted solid state devices comprising depositing a thin film of a high work function metal on a smooth, inert, nonconducting substrate, cooling the substrate and depositing a thin film of an anionic component of a semiconductive compound selected from the group consisting of cadmium sulfide, zinc sulfide and cadmium telluride.

depositing a small amount of the semiconductive compound on the anionic component, heating the substrate and completing deposition of the semiconductive compound, and depositing a thin film of low work function metal on said semiconductive compound.

2. A method according to claim 1 wherein the low work function metal is selected from the group consisting of aluminum, indium, and chromium.

3. A method according to claim 1 wherein the anionic component of the semiconductive compound is sulfur.

4. A method according to claim 1 wherein the high work function metal is selected from the group consisting of gold, palladium, platinum and nickel.

5. A method for producing a solid state device comprising:

depositing a thin film of a low work function metal onto a smooth, inert, nonconducting substrate, depositing a thin film of a semiconductive compound selected from the group consisting of cadium sulfide, zinc sulfide, and cadmium telluride onto the surface of said thin metal film, depositing a layer of the anionic component of said semiconductive compound onto said semiconductive compound, depositing a thin film of high work function metal onto the anionic component, cooling the device and depositing a thin film of the anionic component onto the high work function metal, depositing a small amount of said semiconductive compound onto the cold anionic component surface, raising the temperature of the device and completing the deposition of said semiconductive compound and depositing a thin film of a low work function metal onto said semiconductive compound.

6. A method according to claim 5 wherein the low work function metal is selected from the group consisting of aluminum, indium, and chromium.

7. A method according to claim 5 wherein the high work function metal is selected from the group consisting of gold, palladium, platinum and nickel.

8. A method according to claim 5 wherein the anionic component is sulfur.

References Cited

UNITED STATES PATENTS

| | | | |
|---|---|---|---|
| 3,202,825 | 8/1965 | Brown et al. | 117—217X |
| 3,415,678 | 12/1968 | Guiterrez et al. | 117—200 |

RALPH S. KENDALL, Primary Examiner

U.S. Cl. X.R.

117—106, 200, 212